United States Patent
Elsayed et al.

(10) Patent No.: US 10,355,477 B2
(45) Date of Patent: Jul. 16, 2019

(54) DIGITAL SIGNAL TRANSFER BETWEEN MULTIPLE VOLTAGE DOMAINS

(71) Applicant: Silicon Laboratories Inc., Austin, TX (US)

(72) Inventors: Mohamed Elsayed, Austin, TX (US); Matthew Powell, Austin, TX (US); Nicholas M. Atkinson, Austin, TX (US); Praveen Kallam, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 744 days.

(21) Appl. No.: 14/927,810

(22) Filed: Oct. 30, 2015

(65) Prior Publication Data

US 2017/0126005 A1    May 4, 2017

(51) Int. Cl.
| | | |
|---|---|---|
| *H02J 1/10* | (2006.01) | |
| *G06F 1/26* | (2006.01) | |
| *H03K 19/0185* | (2006.01) | |
| *G06F 1/28* | (2006.01) | |
| *G06F 1/30* | (2006.01) | |
| *H02J 1/00* | (2006.01) | |

(52) U.S. Cl.
CPC ................. *H02J 1/10* (2013.01); *G06F 1/26* (2013.01); *G06F 1/28* (2013.01); *G06F 1/305* (2013.01); *H03K 19/0185* (2013.01); *H02J 2001/008* (2013.01)

(58) Field of Classification Search
CPC .... H02J 1/10; H02J 2001/008; H03K 17/687; H03K 17/6871; H03K 19/0185; G06F 1/26
See application file for complete search history.

(56) References Cited

U.S. PATENT DOCUMENTS

| | | | | |
|---|---|---|---|---|
| 2005/0046461 A1* | 3/2005 | Huang | ...................... | H02J 1/10 327/407 |
| 2008/0048729 A1* | 2/2008 | Ehrenreich | ......... | G03F 7/70516 327/63 |
| 2014/0346878 A1* | 11/2014 | Umeyama | .............. | H03K 3/012 307/52 |

FOREIGN PATENT DOCUMENTS

EP          2680104 A2 *   1/2014   ............... G06F 1/30

OTHER PUBLICATIONS

Elsayed et al., "Maximum Supply Voltage Selection", U.S. Appl. No. 14/860,186, filed Sep. 21, 2015, 41 pgs.

* cited by examiner

*Primary Examiner* — Jared Fureman
*Assistant Examiner* — Emmanuel Dominique
(74) *Attorney, Agent, or Firm* — Egan Peterman Enders Huston

(57) ABSTRACT

Circuitry and methods are provided that may be implemented to transfer digital signals between multiple voltage domains while some of these domains may be invalid, e.g., such as to transfer a digital signal from a source voltage domain to a destination voltage domain while the voltage of the source domain is zero or invalid. Possible implementations include, but are not limited to, for power selection and distribution in an integrated circuit chip that has multiple power sources (e.g., such as main power supply and a backup power supply), and in which at startup the chip is agnostic of (or is not aware of) which power supply or power supplies is actually powered and available.

23 Claims, 7 Drawing Sheets

US 10,355,477 B2

DIGITAL SIGNAL TRANSFER BETWEEN MULTIPLE VOLTAGE DOMAINS

FIELD OF THE INVENTION

This invention relates to digital signal transfer and, more particularly, to digital signal transfer between multiple voltage domains.

BACKGROUND

FIG. 1 illustrates a conventional signal transfer circuit 100 of an integrated circuit chip system that is supplied by multiple different power sources. Signal transfer circuitry is configured to transfer digital signals between two different voltage domains, namely source domain 102 that is supplied by vdd_source supply and destination domain 104 that is supplied by vdd_destination supply. In FIG. 1, signal transfer circuit 100 is part of power selection circuitry for the multi-power source system in which the source domain can be running from a selected one of multiple power sources and the destination domain is always running from the power source having the highest voltage, such that vdd_source may be lower than vdd_destination. As shown, a power selection control signal (A) is provided to source domain 102 from power-on-reset circuitry (POR) and power-management-circuitry (PMU) to select one of the multiple system power supplies. Source domain 102 responds to power-selection control-signal A by supplying a source mux-control-signal (C) to destination domain 104, and destination domain 104 responds to logic of destination mux-control-signal (E) to power supply mux circuitry to cause the mux circuitry to select one of multiple alternate power supplies to supply the system circuitry, including POR and PMU circuitries.

As shown in FIG. 1, source domain 102 includes first and second inverters supplied by vdd_source, with the first inverter coupled together to transfer an inverted control signal (B) as shown to the second inverter, which in turn produces the source mux-control-signal C that is supplied to destination domain 104. Destination domain 104 includes an unbalanced level shifter having a ratio of 1 to X in the N-channel metal-oxide-semiconductor (NMOS) field-effect transistor side of the level shifter, and produces the destination mux-control-signal E via an intermediate signal (D) of the level shifter as shown. In particular, FIG. 1 illustrates a startup operating condition for the multi-power source system in which signals A, B and C are supposed to be equal to 0 volts, vdd_source, and 0 volts, respectively (i.e., representing logic states of A="0", B="1", and C="0") so as to control the mux circuitry to select a default startup system power supply corresponding to logic state "0". However, at system startup, vdd_source can be low and not sufficiently high enough to represent valid logic signals. Under such a condition, the logic values "0" and "1" for signals A, B and C may be misrepresented by hundreds of millivolts instead of the intended values of 0 volts, vdd_source and 0 volts respectively.

Conventional signal transfer circuit 100 is configured to operate assuming that all the logic signals are going to have the same voltage levels, so that signals A, B and C are each going to be in the order of ~100 mVsh range. Under such conditions, the unbalanced level shifter of destination domain 104 is designed to resolve the destination mux-control-signal E correctly as "0", even when the source mux-control-signal C input to destination domain 104 is invalid such as during system startup. However, the assumption that the signals in the source domain 102 will always have the same voltage level independent of their logic value is not correct. If voltage of the source mux-control-signal C is higher than inverted control signal B, it can overcome the unbalance in the level shifter and flip the level shifter output to enforce logic of destination mux-control-signal E to be "1", causing the power supply mux to change the system power supply including the source domain. In such a scenario, the chip might not startup correctly or might never startup at all.

SUMMARY

Disclosed herein are circuitry and methods that may be implemented to transfer digital signals between multiple voltage domains while some of these domains may be invalid, e.g., such as to transfer a digital signal from a source voltage domain to a destination voltage domain while the voltage of the source domain is zero or invalid. In one exemplary embodiment, the destination domain voltage may be larger or smaller than the source domain voltage. In another exemplary embodiment the disclosed circuitry and methods may be implemented for power selection and distribution for a multi-power supply system in which the source domain runs from any selected one of multiple different available power sources while the destination domain always runs from the available power source having the highest voltage. In a further embodiment, the disclosed circuitry and methods may be implemented without the presence of a differential/complementary signal provided from the source domain to the destination domain (as is required by conventional signal transfer circuitry), while at the same time ensuring the destination domain correctly evaluates an invalid input logic received from the source domain as logic "0". As used herein, "invalid" means the supply voltage is not high enough to cause proper operation of a digital logic gate, e.g., inverter. The disclosed circuitry and methods may be implemented in one exemplary embodiment for power selection and distribution in an integrated circuit chip that has multiple power sources (e.g., such as main power supply and a backup power supply), and in which at startup the chip is agnostic of (or is not aware of) which power supply or power supplies is actually powered and available.

In one exemplary embodiment, the disclosed circuitry and methods may be implemented within power selection and distribution circuitry of an integrated circuit that is configured to be powered by multiple power sources. In such an embodiment, destination power-selection-control-signals may be provided from the destination domain (e.g., to multiplexer circuitry) to cause selection of a given one of the available power sources for powering the source domain, while the source domain provides source power-selection-control-signals to control the destination domain to output the destination power-selection-control-signals from the destination domain to cause selection of the given power source for the source domain. The power selection and distribution circuitry may be implemented in further embodiment as part of a multi-power source system in which the source domain is supposed to be supplied from a specific predefined default power supply at startup of the system which is indicated by source power-selection-control-signal logic "0". In such an embodiment, the destination domain is configured to always evaluate an invalid source power-selection-control-signal received at system startup from the source domain as having logic "0" that specifies the correct predefined default power supply for the source domain, rather than misinterpreting an invalid source power-selection-control-signal as logic "1" and choosing an incorrect power-source for the source domain. This may occur, for example, when the selected power source for the source domain has an invalid voltage level that causes the source power-selection-control-signal to be invalid.

In one respect, disclosed herein is a method of operating circuitry that is coupled to receive multiple power supplies. The method may include: selecting a first power supply having the largest voltage among the multiple power supplies that are coupled to the circuitry, the multiple power supplies including a default power supply and an alternate power supply. The method may also include using the selected largest voltage first power supply to power a first portion of the circuitry to: generate a first control signal in a high logic state to control a switching circuit to selectively couple the default power supply to at least one power supply rail to supply power for power-consuming circuit components of the circuitry in response to a low logic state of at least one second control signal received from a second portion of the circuitry, and generate the first control signal in a low logic state to control a switching circuit to selectively couple the alternate power supply to at least one power supply rail to supply power for power-consuming circuit components of the circuitry in response to a high logic state of at least one second control signal received from a second portion of the circuitry. The method may also include providing a current from one of the multiple power supplies to maintain a voltage of the first control signal in the high logic state to control the switching circuit to couple the default power supply to the at least one power supply rail when the second control signal is not in the high logic state.

In another respect, disclosed herein is an apparatus including circuitry configured for coupling between power consuming circuitry and multiple power supplies that include a default power supply and an alternate power supply. The circuitry of the apparatus may include: a switching circuit configured to selectively couple each of the multiple power supplies to at least one power supply rail to supply power for the power-consuming circuit components; a first circuit portion coupled to be powered by a first power supply that has the largest voltage among the multiple power supplies, the multiple power supplies including a default power supply and an alternate power supply. The first circuit portion may be configured to: generate a first control signal in a high logic state to control the switching circuit to selectively couple the default power supply to the at least one power supply rail to supply power for power-consuming circuit components of the circuitry in response to a low logic state of at least one second control signal received from a second portion of the circuitry, and generate the first control signal in a low logic state to control a switching circuit to selectively couple the alternate power supply to at least one power supply rail to supply power for power-consuming circuit components of the circuitry in response to a high logic state of at least one second control signal received from a second portion of the circuitry. The circuitry may also include a current source coupled to provide a current from one of the multiple power supplies to maintain a voltage of the first control signal in the high logic state to control the switching circuit to couple the default power supply to the at least one power supply rail when the second control signal is not in the high logic state.

In another respect, disclosed herein is an integrated circuit device configured for coupling to multiple power supplies that include a default power supply and an alternate power supply. The integrated circuit device may include: power consuming circuitry coupled to receive power from at least one power supply rail; a switching circuit configured to selectively couple each of the multiple power supplies to the power supply rail to supply power for the power-consuming circuit components; a first circuit portion coupled to be powered by a first power supply that has the largest voltage among the multiple power supplies, the multiple power supplies including a default power supply and an alternate power supply. The first circuit portion may be configured to: generate a first control signal in a high logic state to control the switching circuit to selectively couple the default power supply to the at least one power supply rail to supply power for power-consuming circuit components of the circuitry in response to a low logic state of at least one second control signal received from a second portion of the circuitry, and generate the first control signal in a low logic state to control a switching circuit to selectively couple the alternate power supply to at least one power supply rail to supply power for power-consuming circuit components of the circuitry in response to a high logic state of at least one second control signal received from a second portion of the circuitry. The integrated circuit may also include a current source coupled to provide a current from one of the multiple power supplies to maintain a voltage of the first control signal in the high logic state to control the switching circuit to couple the default power supply to the at least one power supply rail when the second control signal is not in the high logic state.

DESCRIPTION OF ILLUSTRATIVE EMBODIMENTS

Figure 1:
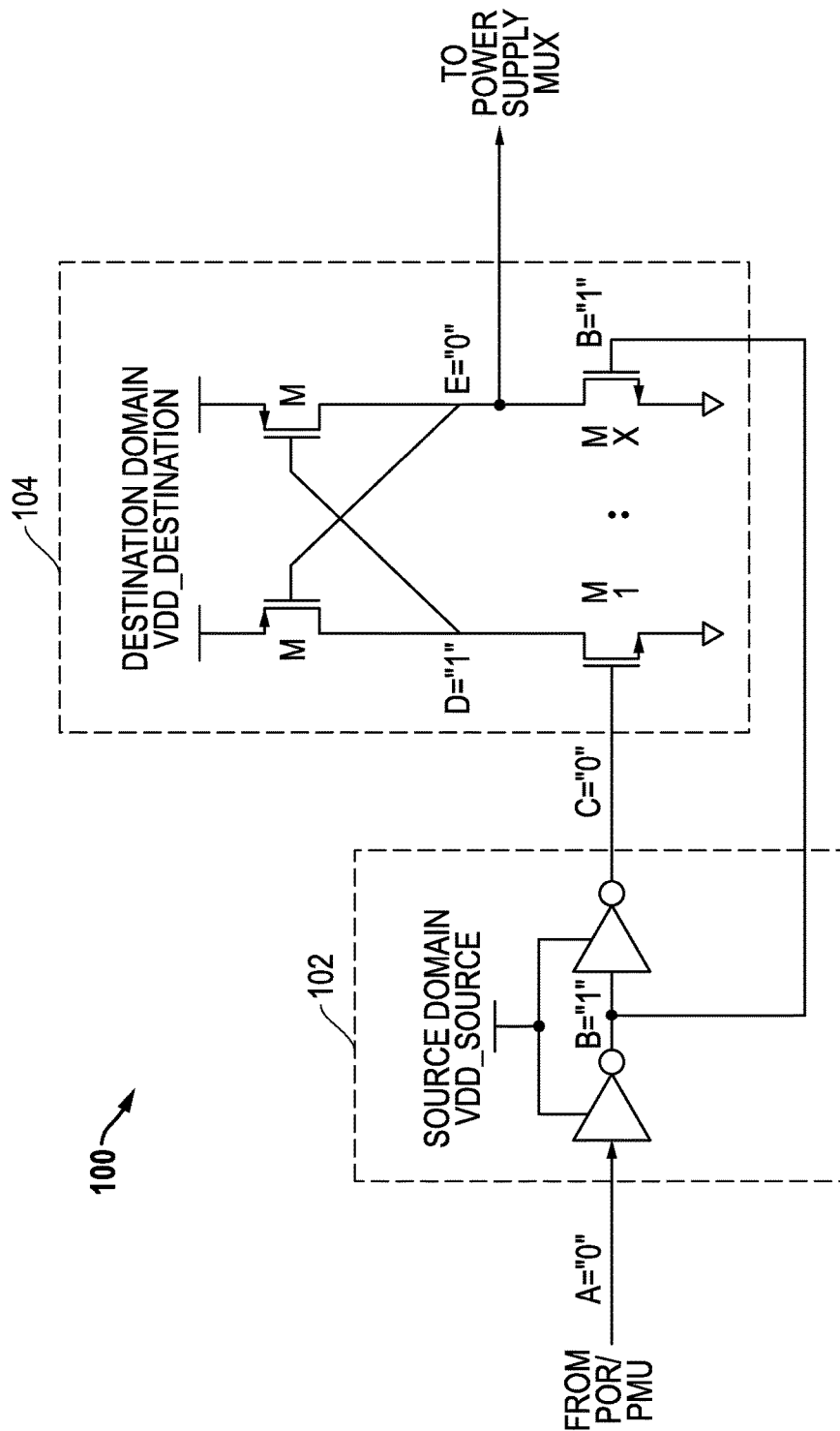
FIG. 1 illustrates a conventional signal transfer circuit of an integrated circuit chip system that is supplied by multiple different power sources.
Figure 2:
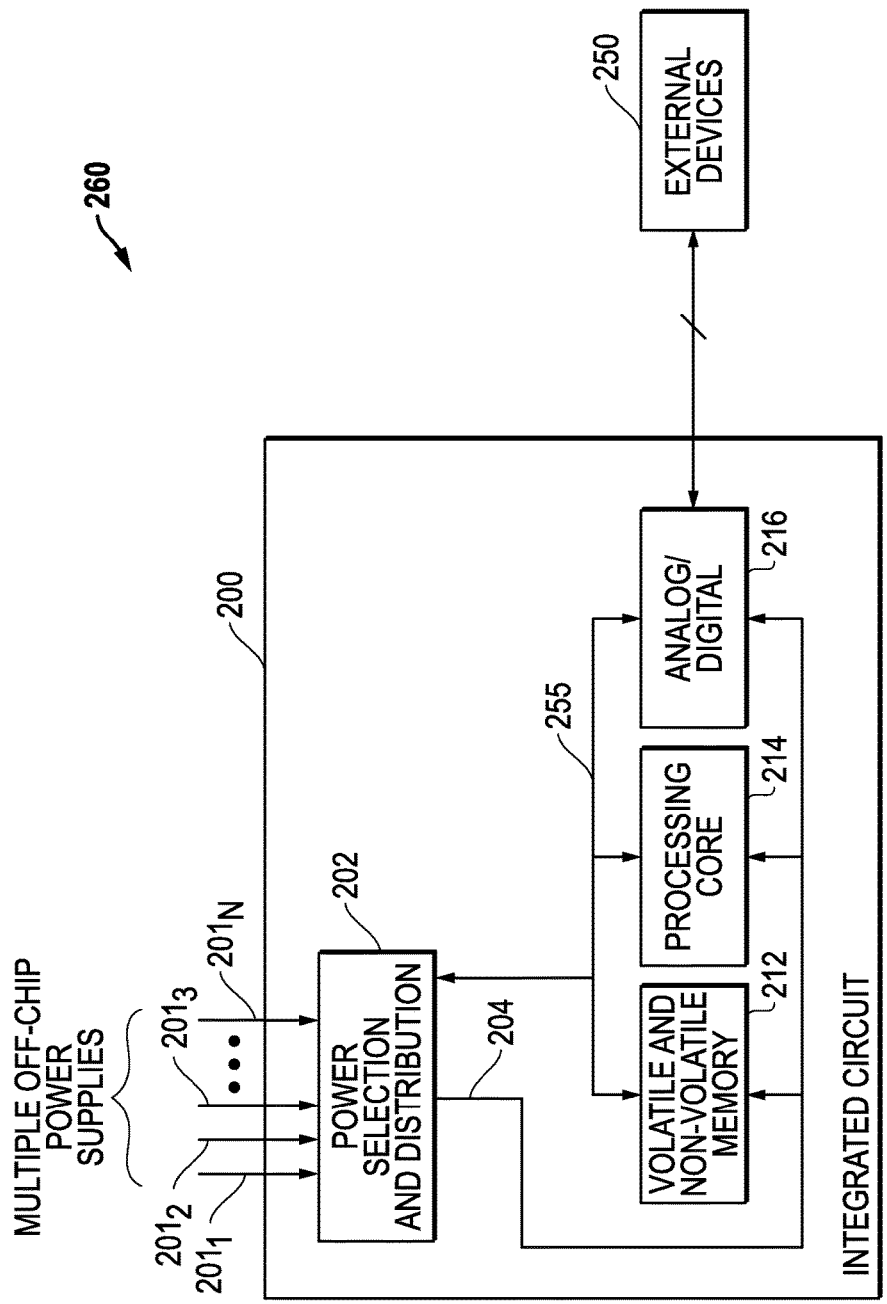
FIG. 2 illustrates an electronic system according to one exemplary embodiment of the disclosed systems and methods.

FIG. 2 illustrates one exemplary embodiment of an electronic system 260 that includes an integrated circuit (IC) device 200 that is configured to be coupled for supply from multiple different off-chip power supplies $201_1$ to $201_N$, such as an AC power adapter, a battery, a Universal Serial Bus (USB) interface, etc. In this regard, multiple power supplies $201_1$ to $201_N$ may have different supply voltages from each other at any given time. IC device 200 may be fabricated on a single semiconductor die, however it will be understood that in other embodiments all or part of circuitry of IC device 200 may be fabricated on multiple semiconductor dies. Additionally, it is also possible that one or more of the circuit features of IC device 200 may alternatively be fabricated as discrete circuitry. In one embodiment, IC device 200 may be packaged to form a semiconductor package that is included as part of electronic system 260.

In one embodiment, IC device 200 may be incorporated as part of an electronic system 260 that is a mobile electronic device (such as a smartphone or tablet, etc.) although other non-portable applications for integrated circuit device 200 are also possible. In one embodiment, integrated circuit device 200 may be a microcontroller unit (MCU) that is coupled to control one or more external devices 250, such as a lighting element (such as a light emitting diode (LED), for example); an electrical motor, a household appliance, an inventory control terminal, a computer, a tablet, a smart power meter, a wireless interface, a cellular interface, an interactive touch screen user interface, etc. Although the electronic system embodiment 260 is utilized herein for discussion, it will be understood that the disclosed circuitry and methods may be implemented to transfer a digital signal between multiple voltage domains with alternate system configurations and in any other type of system architecture or environment having multiple voltage domains.

In the illustrated embodiment of FIG. 2, IC device 200 includes multiple power-consuming circuit components in the form of processing core 214, non-volatile and/or volatile memory 212, and analog/digital circuit components 216 that are coupled as shown to control and/or otherwise interface with the external devices 250. Analog/digital circuit components 216 may include, for example, peripheral digital components that communicate with the processing core 214 and memory 212 over a data communication bus 255, such as direct memory access (DMA) engines, universal asynchronous receiver/transmitter (UART) devices, serial peripheral interface (SPI) devices, programmable timers, a packet radio, I/O buffers, a Universal Serial Bus (USB) interface, etc. Analog/digital components 216 may also include, for example, analog circuit components that receive analog signals, such as analog-to-digital converters (ADCs) and comparators. Other analog circuit components that may be present include, but are not limited to analog circuit components that provide analog signals, such as current drivers.

Still referring to the embodiment of FIG. 2, IC device 200 also includes power selection and distribution circuitry 202 that is coupled between the multiple power supplies $201_1$ to $201_N$ and one or more power supply rail/s 204 to supply power for the power-consuming circuit components 212, 214, 216 of integrated circuit device, as well as any other power-consuming circuit components that may be present, e.g., such as DC-to-DC regulators or other power regulation circuitry. In the illustrated embodiment, power selection and distribution circuitry 202 may be configured with logic and switching circuitry to select one of the available multiple power supplies 201 and to distribute the selected supply voltage to power consuming components of integrated circuit device 200 via power supply rail/s 204. As will be described further herein, power selection and distribution circuitry 202 may be configured to automatically select and couple a predefined default supply (e.g., upon startup of system 260), and/or to respond to a user selection or external device logic selection of any given power supply 201 by coupling that power supply 201 to power supply rail/s 204. Such a user or system power selection may be provided, for example, by a command received from off-chip from external system devices 250 via analog/digital components 216 and data communication path 255. Although power selection and distribution circuitry 202 is illustrated as a separate functional block in FIG. 2, it will be understood that in one exemplary embodiment logic of power selection and distribution circuitry 202 may be implemented within processing core 214.

Figure 3:
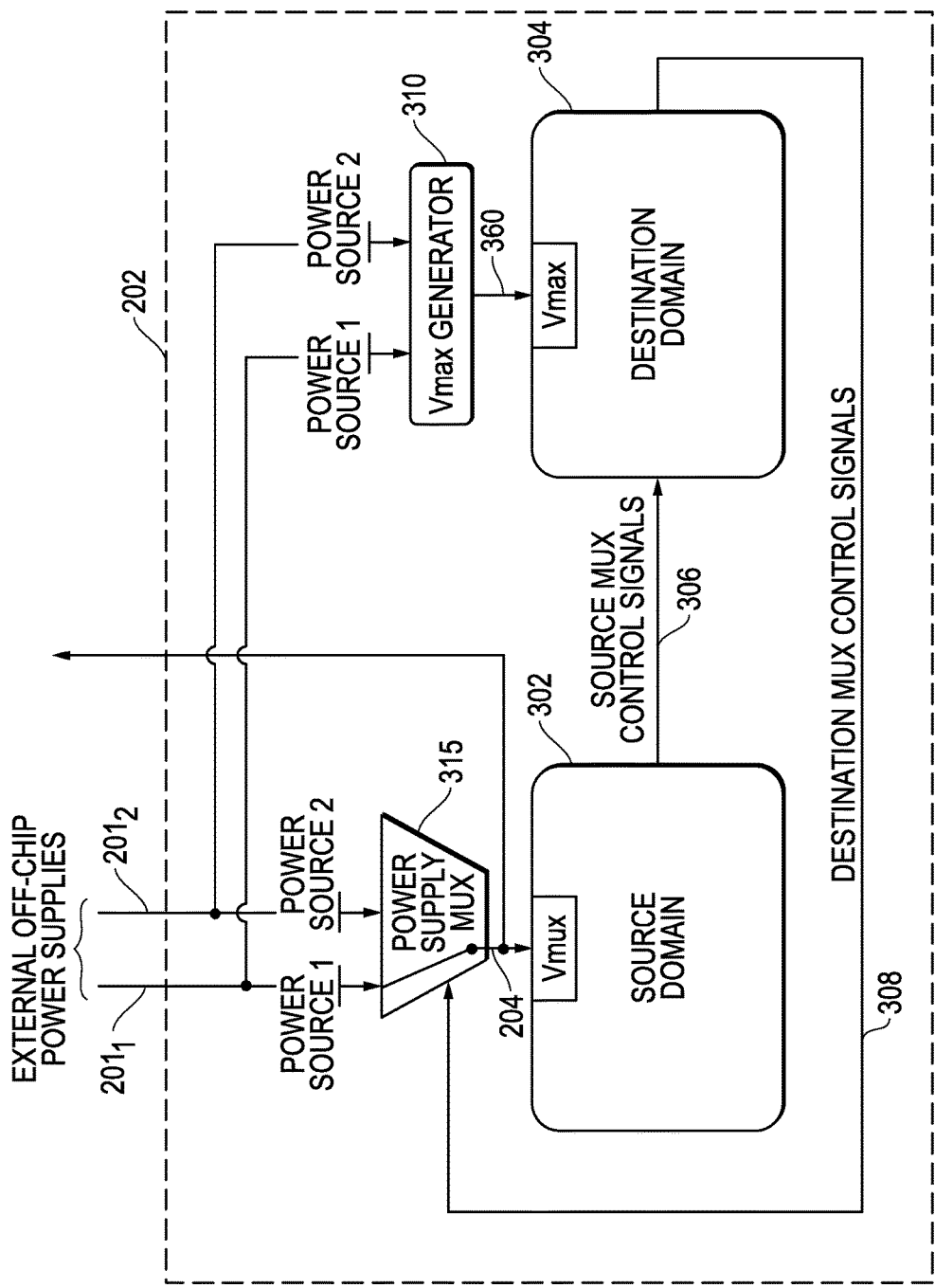
FIG. 3 illustrates power selection and distribution circuitry according to one exemplary embodiment of the disclosed systems and methods.

FIG. 3 illustrates a simplified block diagram of one embodiment of power selection and distribution circuitry 202. In this embodiment, power selection and distribution circuitry 202 includes a power supply multiplexer (mux) 315 or any other suitable power supply switching circuit that is coupled to two different available off-chip power supplies $201_1$ and $201_2$ as shown. In this embodiment, power supply mux 315 is configured to select one of two power supplies $201_1$ or $201_2$ for supplying power (having a voltage Vmux) to supply rail/s 204 in response to destination mux-control-signals 308 received from destination domain circuitry 304. As will be described further herein, destination domain circuitry 304 is in turn configured to produce destination mux-control-signals 308 based on power selection control signals in the form of source mux-control-signals 306 provided to destination domain circuitry 304 by source domain circuitry 302. In this embodiment, destination domain circuitry 304 always runs from the available power supply 201 having the highest voltage. In this regard, power selection and distribution circuitry 202 includes Vmax generator circuitry 310 that is coupled between power supplies $201_1$ and $201_2$ and destination domain circuitry 304, and that is configured to always select the power supply 201 having the highest voltage for supplying power 360 (having a voltage Vmax) to power destination domain circuitry 304. The highest voltage power supply is always selected for powering destination domain circuitry 304 to ensure that the destination mux-control-signals 308 have sufficient voltage for properly controlling operation of power supply mux 315. Thus, at any given time, source domain circuitry 302 is powered by a power supply 204 having voltage Vmux that may be less than the power supply 360 having voltage Vmax that is powering destination domain circuitry 304. Examples of suitable switching circuit configurations may be found described in U.S. patent application Ser. No. 14/860,186, which is incorporated herein by reference in its entirety.

In an alternative embodiment, destination domain circuitry 304 may be powered from any available power supply 201 to generate the destination mux-control-signal on that available domain. In such an embodiment, this generated destination mux-control-signal may be provided to a level shifter powered from the Vmax domain (e.g., using a Vmax generator circuit such as circuitry 310) to generate a version of mux-control-signal that is on the Vmax domain.

Figure 4:
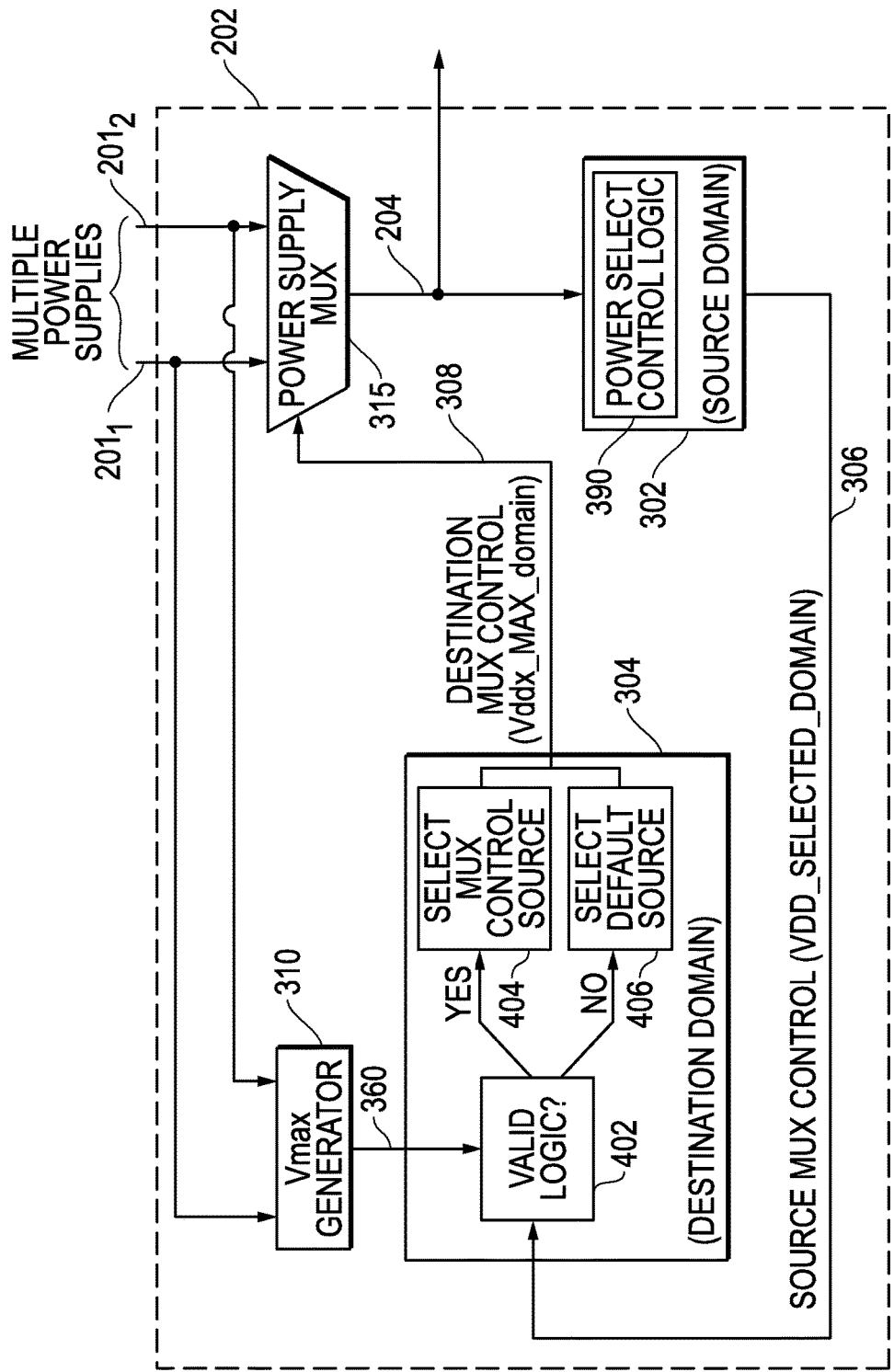
FIG. 4 illustrates logic that may be implemented by source domain circuitry according to one exemplary embodiment of the disclosed systems and methods.

FIG. 4 is a block diagram illustrating one exemplary embodiment of logic that may be implemented by source domain circuitry 302 and destination domain circuitry 304 of power selection and distribution circuitry 202. As shown, source domain circuitry 302 includes power select control logic 390 that may be implemented as any combination of processing logic, active and/or passive circuitry that is configured to select between multiple power supplies $201_1$ and $201_2$ for power supply rail/s 204, e.g., to select a default power supply $201_1$ automatically on start-up and/or to select between different power supplies $201_1$ and $201_2$ in response to user input from external devices 250 or from a logic component of external devices 250, etc. To implement this selection, source domain circuitry 302 provides digital source mux-control-signal 306 that is based on the voltage domain (Vdd_selected_domain) of the currently selected power supply 201 provided to supply rail/s 204 such that source mux-control-signal 306 voltage is equal to the selected Vmux for logic value "1" and is equal to zero volts for "0". For example, a digital source mux-control-signal 306 having a logic value of "0" may be provided to select default power supply $201_1$ for power supply rail/s 204 and a digital source mux-control-signal 306 having a logic value of "1" may be provided to select alternate power supply $201_2$ for power supply rail/s 204.

An invalid voltage level refers to a supply voltage level that is not enough to cause a logic circuit to operate according to its known function, e.g., an inverter's output logic is similar to the input. A valid voltage level is a process dependent and transistor-selection-dependent parameter. For some process nodes a valid voltage level may be hundreds of mV while in other processes or other types of transistors it may be in a single-digit volt range.

As shown in FIG. 4, digital source mux-control-signal 306 of Vdd_selected_domain is provided to destination domain circuitry 304 that includes valid logic detection circuitry 402 configured to detect whether or not source mux-control-signal 306 is a valid logic signal, and to provide a destination mux-control-signal 308 based on this determination. In this regard, valid logic detection circuitry 402 may be configured to detect if the voltage of source mux-control-signal 306 is sufficiently high to be a valid logic "1" signal that indicates a valid selection of alternate power supply $201_2$ in this example. If yes, then in block 404 valid logic detection circuitry 402 outputs to power supply mux 315 a destination mux-control-signal 308 having a logic "1" in the Vdd_max_domain (e.g., to cause power supply mux 315 to select an alternate power supply $201_2$ for power supply rail/s 204). However if valid logic detection circuitry 402 determines that the logic of source mux-control-signal 306 is either zero or not sufficiently high enough to be valid "1" logic, then in block 406 valid logic detection circuitry 402 outputs to power supply mux 315 a destination mux-control-signal 308 having a logic "0" in the Vdd_max_domain (e.g., to cause power supply mux 315 to select default power supply $201_1$ for power supply rail/s 204). In this way, the default power supply is always selected for power supply rail/s 204 and source domain circuitry 302 unless source domain circuitry 302 outputs a valid source mux-control-signal 306 to select alternate power supply $201_2$.

Figure 5:
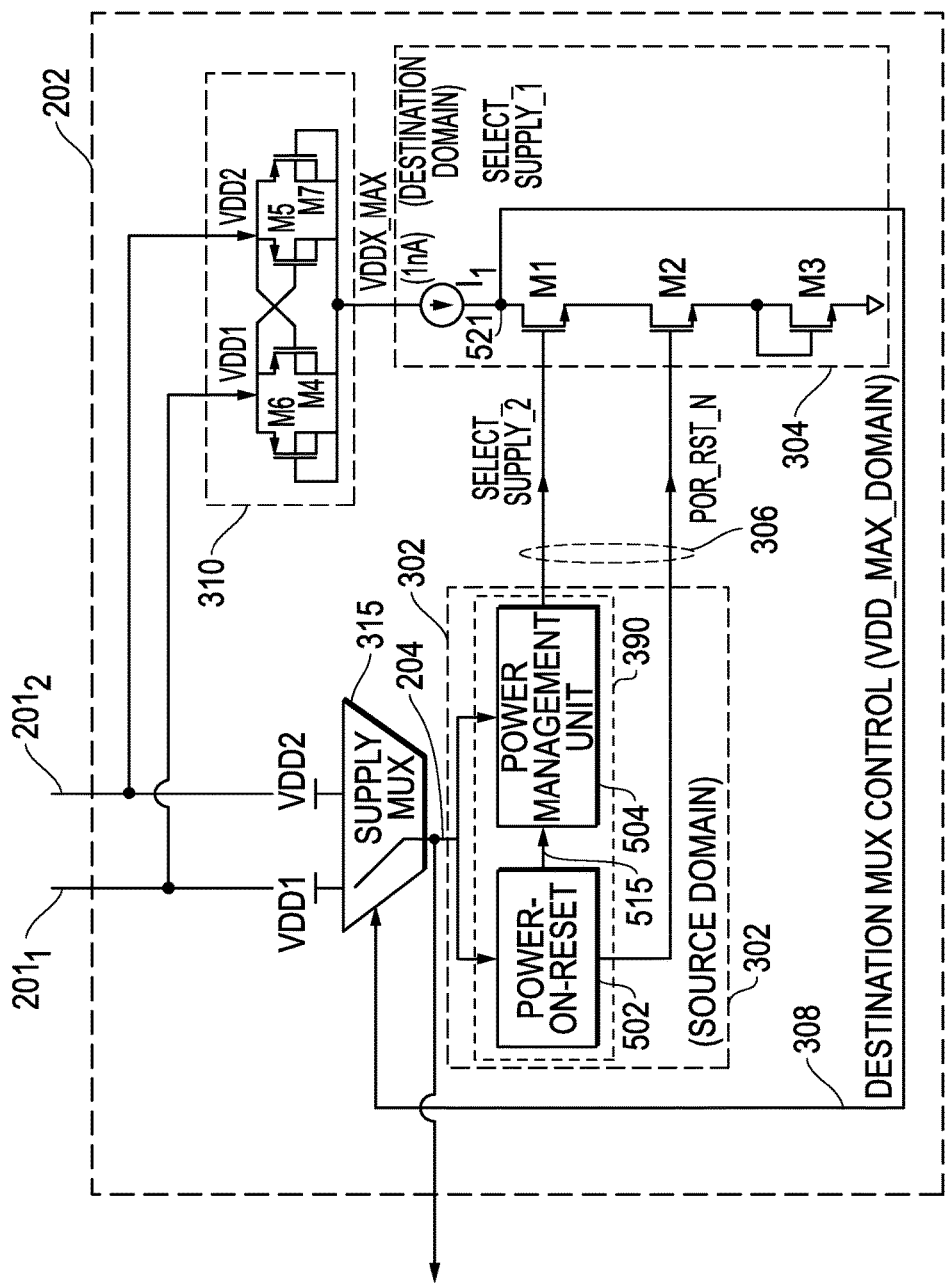
FIG. 5 illustrates power selection and distribution circuitry according to one exemplary embodiment of the disclosed systems and methods.

FIG. 5 illustrates one exemplary embodiment of power selection and distribution circuitry 202 in which source domain circuitry 302 includes a power-on-reset module (POR) 502 and a power-management-unit (PMU) module 504 that are coupled to receive a common power supply selected by power supply mux 315 from one of two available power supplies via supply rail 204, i.e., default power supply $201_1$ (vdd1) or alternate power supply $201_2$ (vdd2). As described further herein, during system startup or whenever source mux-control-signal 306 is invalid as a power selection control signal, power selection and distribution circuitry 202 is configured to maintain node 521 (select_supply_1) and destination mux-control-signal 308 in a high or "1" logic state to cause power supply mux 315 to choose default power supply $201_1$ (vdd1) for supply rail 204. After startup and when por_rst_n and select_supply_2 power selection control signal components of source mux-control-signal 306 are valid, node 521 and destination mux-control-signal 308 are allowed to be pulled low or to a "0" logic state to cause power supply mux 315 to select alternate power supply $201_2$ (vdd2).

As further shown, destination domain circuitry 304 of FIG. 5 is coupled to receive and run from the power supply (vdd1 or vdd2) that has the higher voltage (vddx_max) as provided by Vmax generator 310 such that the destination mux-control-signal (vdd_max_domain) 308 corresponding to the (vdd_selected_domain) 306 received from source domain circuitry 302 is generated using the higher available voltage (vddx_max) to ensure proper operation of power supply mux circuitry 315. As further shown, destination domain circuitry 304 includes a current source $I_1$ (e.g., 1 nanoamp or other suitable greater or lesser current value) that is coupled in series with three NMOS transistors M1, M2 and M3 between vddx_max output of Vmax generator 310 and ground (e.g., circuit ground such as signal ground or any suitable ground reference for power selection and distribution circuitry 202). Destination mux-control-signal 308 is in turn coupled as shown to current source $I_1$ at a node 521 between current source $I_1$ and NMOS transistor M1. In this configuration, destination mux-control-signal (vdd_max_domain) 308 is maintained high or in logic state "1" by current source $I_1$ as long as it is supplied with power from Vmax generator 310 and one of transistors M1, M2 or M3 is turned off. It will be understood that the current of current source $I_1$ may be generated using any current generator circuit known in the art. In one exemplary embodiment, current source $I_1$ may be a resistor coupled between node 521 (select_supply_1) 521 and vddx_max. In such an embodiment, the current rate of current source $I_1$ depends on the power-consumption-budget that is set for the circuit. When source mux-control-signals 306 are logic "1", that current flows from the supply to ground and is a part of the circuit's power consumption.

In the exemplary embodiment of FIG. 5, Vmax generator 310 includes transistors M4, M5, M6 and M7 that are coupled together as shown to generate vddx_max. In this regard, the source of P-channel metal-oxide-semiconductor (PMOS) field-effect transistor M4 is coupled to vdd1 and the gate of PMOS transistor M4 is coupled to vdd2 such that transistor M4 turns on when vdd1 is greater than vdd2 by one threshold voltage to supply vdd1 and turns off when vdd1 is less than Vdd2, and the source of PMOS transistor M5 is coupled to vdd2 and the gate of PMOS transistor M5 is coupled to Vdd1 such that transistor M5 turns on when vdd2 is greater than vdd1 by one threshold voltage, and turns off when vdd2 is less than vdd1. If the two voltages are within one threshold voltage from each other, M4 and M5 are both off while M6 and M7 act as a diode that ensures vddx_max does not drop from the highest voltage by more than one diode voltage. This action results in the higher voltage of vdd1 or vdd2 always being coupled by Vmax generator 310 to supply vddx_max to destination domain circuitry 304. It will be understood that the illustrated circuit components of Vmax generator 310 of FIG. 5 is exemplary only, and that any other circuit configuration suitable for selecting and supplying the highest voltage power source of multiple available power supplies may be alternatively employed, for example, such as circuitry described and illustrated in U.S. patent application Ser. No. 14/860,186, which is incorporated herein by reference in its entirety.

Still referring to FIG. 5, POR module 502 of source domain circuitry 302 may include circuitry (e.g., including one or more capacitors in series with one or more resistors, etc.) coupled to provide a reset signal (por_rst_n) to the gate of NMOS transistor M2 of destination domain circuitry 304 that has a logic value that is based on the detected state of power supplied to source domain circuitry 302. In this embodiment, POR 502 is configured to turn on transistor M2 by providing por_rst_n as high or logic "1" when selected power supplied from power supply mux 315 is detected as good (e.g., has stabilized at a sufficiently high voltage). When good power is detected, POR 502 also supplies a good power indication signal 515 to PMU 504 as shown. As will be described further herein, when transistor M2 is on, power supply selection of mux 315 is controlled by action of transistor M1. At all other times, POR 502 is configured to maintain transistor M2 in the off condition by providing por_rst_n as logic "0" gate of transistor M2 in the absence of detected good power supplied from power supply mux 315 so as to force selection of default power supply 201$_1$ (vdd1) by virtue of current from current source I$_1$.

Still referring to FIG. 5, PMU module 504 of source domain circuitry 302 may include circuitry or processing logic implemented within IC device 200 that is configured to receive the good power indication signal 515 from POR 502, and to respond to the presence of good power by selectively providing select_supply_2 signal to the gate of NMOS transistor M1 of destination domain circuitry signal that has a logic value that is based on a power selection input e.g., in response to a user selection or external device logic selection of power source 201$_1$ (vdd1) or 201$_2$ (vdd2). Specifically in the illustrated embodiment, PMU 504 provides select_supply_2 signal as logic "1" to select alternate power supply 201$_2$ (vdd2) or provides select_supply_2 signal as logic "0" to select default power supply 201$_1$ (vdd1). In the absence of the indication of good power from POR 502, logic bit of select_supply_2 signal provided by PMU 504 may be "0" or otherwise low such that NMOS transistor M1 remains in the off condition and default power supply default power supply 201$_1$ (vdd1) is selected. Moreover, regardless of state of transistor M1, POR 502 maintains transistor M2 in the off condition in the absence of the presence of good power to force selection of default power supply 201$_1$ (vdd1) by virtue of current source I$_1$.

When presence of good power is detected at power supply rail 204, POR 502 provides por_rst_n as high or logic "1" to turn on transistor M2. When transistor M2 is on, selection of power supply 201$_1$ (vdd1) or 201$_2$ (vdd2) by power supply mux 315 is controlled by the state of NMOS transistor M1. In this regard, PMU 504 may selectably provide select_supply_2 signal as logic "0" to gate of transistor M1 to select default power supply 201$_1$ (vdd1), or as logic "1" to select alternate power supply 201$_2$ (vdd2). When PMU 504 provides select_supply_2 signal as logic "0" then transistor M1 remains off, and thus destination mux-control-signal 308 remains high due to current source I$_1$. However, when PMU 504 provides select_supply_2 signal as logic "1" then transistor M1 turns on to couple current source I$_1$ to ground through optional NMOS transistor M3. As long as voltage of vddx_max is sufficiently high at the drain of optional transistor M3 so as to turn on transistor M3 (i.e., via the gate of transistor M3 coupled to the drain of transistor M3), then voltage at node 521 is pulled down to logic state "0" which causes power supply mux 315 to select alternate power supply 201$_2$ (vdd2) to supply rail 204. In this regard, optional transistor M3 will be turned on and passing current of current source I$_1$ (e.g., 1 nanoamp) only if the voltage level of supply rail 204 is high enough to turn on M1 and M2 (one V$_{GS}$ voltage) plus one V$_{GS}$ voltage of transistor M3. Thus transistor M3 may be optionally present to increase the voltage threshold at which the output of POR 502 (por_rst_n) is considered valid logic "1" so as to increase the threshold at which the voltage level of the logic is considered correct.

Referring now to operation of power selection and distribution circuitry 202 of FIG. 5, assuming at startup of system 260 that alternate power supply vdd2 (201$_2$) is available (e.g., such as 2 volts in one example) while default power supply vdd1 (201$_1$) is not available yet (e.g., zero volts), then vddx_max output by Vmax generator 310 will track vdd2. Since vdd1 is not available, the outputs of POR 502 and PMU 504 (i.e., por_rst_n and select_supply_2, respectively) will be zero voltage and transistors M1 and M2 will therefore be turned off. Thus, node 521 (select_supply_1) and destination mux-control-signal 308 are pulled up high to vddx_max=vdd2 by current source I$_1$. Consequently, proper selection by power supply mux 315 of power supply for POR 502 and PMU 504 is enforced under these conditions to be default power supply vdd1 (201$_1$).

Next, assuming that default power supply vdd1 (201$_1$) starts to ramp up slowly after system startup, POR 501 and PMU 504 will have a supply voltage less than one volt and in the order of hundreds of millivolts provided from default power supply vdd1 (201$_1$). However, in this example, POR 501 and PMU 504 require a power supply of about 1.5 volts to produce valid logic signals. Thus, the output signals (por_rst_n and select_supply_2) to transistors M2 and M1 of destination domain circuitry 304 are undefined, e.g., in the order of hundreds of millivolts which is in-between "0" and "1" logic states. Destination domain circuitry 304 of FIG. 5 is configured as previously described to evaluate the validity of source mux-control-signals 306 (in this case por_rst_n and select_supply_2) using current source I$_1$ and transistor M3 to ensure that select_supply_1 and destination mux-control-signal 308 has a voltage that causes power supply mux 315 to choose the correct default power supply vdd1 for power supply mux 315 in such a case. As previously described, transistor M3 is incorporated in the circuit and configured to operate like a diode by coupling its gate terminal to its drain terminal. Moreover, select_supply_1 node will only drop to the voltage of the low logic state if transistors M1 and M2 are turned on and able to pass more than 1 nA of current from I$_1$ through transistor M3. In one embodiment, for M1 and M2 to be on, their gate voltages should be at least equal to 2V$_{GS\_1n}$, where V$_{GS\_1n}$ is the gate source voltage of the NMOS transistor M1 or M2 when its drain current is 1 nA. Consequently, select_supply_1 node 521 cannot go to zero voltage except if vdd1 is equal or higher than 2V$_{GS\_1n}$. However, a 2V$_{GS\_1n}$ in voltage for vdd1 is selected to be high enough for the POR 502 and PMU 504 to have correct outputs and to set select_supply_2 and por_rst_n signals each to a valid voltage level of zero volts. Consequently, a correct startup of the chip that selects default power supply vdd1 is ensured under the above conditions.

FIG. 5 illustrates an embodiment having two power supplies 201. It will be understood that in another exemplary embodiment having more than two power supplies 201$_1$ to 201$_N$, that N−1 instances of destination domain circuitry 304 may be coupled between source domain circuitry 302 and power supply mux 315. Each instance of destination domain circuitry 304 may receive a corresponding source mux-control-signal 306 from source domain circuitry 302, such that when all source mux-control-signals 306 are logic "0", then all destination mux-control-signals 308 will be maintained in high or "1" logic state to cause power supply mux 315 to choose default power supply 201$_1$ (vdd1) for supply rail 204 in a similar manner as previously described.

Figure 7:
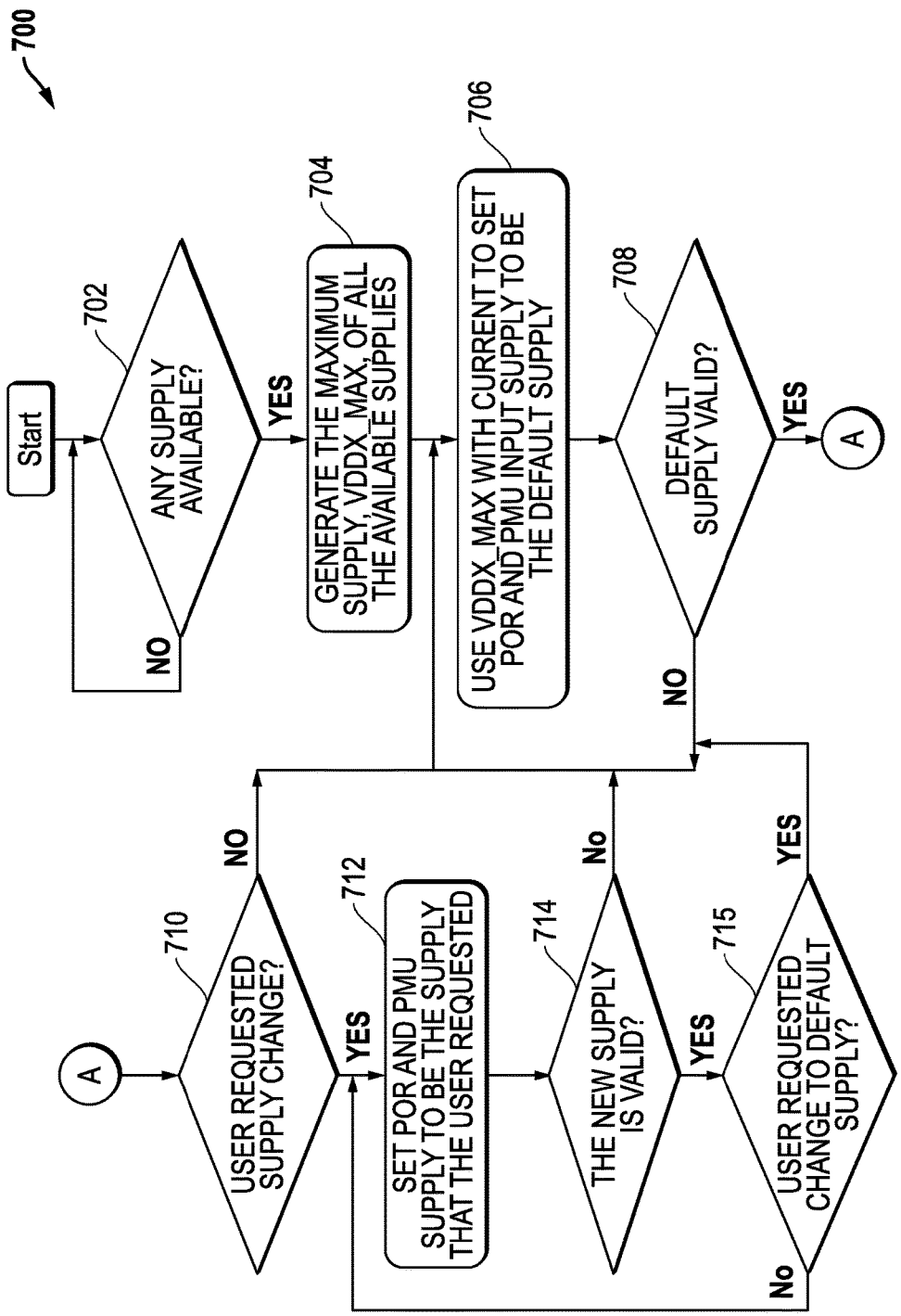
FIG. 7 illustrates power supply selection methodology according to one exemplary embodiment of the disclosed circuit topologies and methods.

FIG. 7 illustrates one exemplary embodiment of power supply selection methodology 700 such as may be performed by power selection and distribution circuitry 202 of FIG. 5. As shown, methodology 700 starts in step 702 (e.g., at system startup) where it is determined whether any power supply (e.g., default power supply vdd1 or alternate power supply vdd2) is available to integrated circuit 200. If not, then step 702 repeats until one or more power supplies is detected. However, if the presence of a power supply is detected in step 702, then methodology 700 proceeds to step 704 where the detected power supply having the maximum voltage is selected and generated as vddx_max supply (e.g., by Vmax generator 310) in destination domain circuitry 304. Methodology 700 then proceeds to step 706 where vddx_max supply from step 704 is used with current (e.g., produced by current source $I_1$ of FIG. 5) in destination domain circuitry 304 to produce destination mux-control-signal 308 to cause power supply mux 310 to set default power supply vdd1 for powering POR 502 and PMU 504 of source domain circuitry 302 and other chip circuitry coupled to power supply rail/s 204. Next, in step 708, valid logic detection circuitry 402 of destination domain circuitry 304 determines whether the default power supply vdd1 is valid, e.g., by virtue of signal voltage of source mux-control-signals 306. If not, then methodology 700 repeats to steps 706 and 708 until a valid default power supply vdd1 is detected by destination domain circuitry 304.

Still referring to FIG. 7, once a valid default power supply vdd1 is detected in step 708, then methodology 700 proceeds to step 710 where power selection and distribution circuitry 202 is powered by default power supply vdd1 and monitors for a user-requested power supply change (e.g., received from user in PMU 504). As long as no change of power supply is requested, steps 706-710 are repeated during which default power supply vdd1 is selected. However, once a user-requested power supply change to the alternate power supply vdd2 is received in step 710, then methodology proceeds to step 712 where source domain circuitry 302 attempts to set power supply for POR 502 and PMU 504 to alternate power supply vdd2, e.g., via source mux-control-signals 306. In step 714, valid logic detection circuitry 402 of destination domain circuitry determines if the new requested alternate supply vdd2 is valid in step 714, e.g., based on the validity of source mux-control-signals 306. If the new requested alternate supply vdd2 is determined valid, then destination domain circuitry uses destination mux-control-signal 308 to cause power supply mux 315 to select alternate power supply vdd2 for supplying power to supply rail/s 204 and power source domain circuitry 302, and methodology 700 proceeds to step 715 where power selection and distribution circuitry 202 monitors as shown for a user-requested power supply change (received from a user in PMU 504) back to the default power supply vdd1. If a request is received for a change back to default power supply vdd1, then methodology 700 repeats back to step 706 as shown, where default power supply vdd1 is selected. Otherwise methodology 700 returns back to step 712 and repeats as shown. However, if the new requested alternate power supply vdd2 is found not to be valid in step 714, then methodology 700 repeats back to step 706 as shown. If the new requested alternate power supply vdd2 is invalid, output of POR 502 will go to zero and regardless of the level of the select_supply_2 signal, signal 308 will be logic value "1" and the system will go back to the default supply vdd1.

It will be understood that the methodology of FIG. 7 is exemplary only and that any combination or order of additional, fewer and/or alternative steps may be employed that is suitable for transferring digital signals between multiple voltage domains as described elsewhere herein. Moreover, it will be understood that methodology 700 is described with reference to the embodiment of FIG. 5 for purposes of illustration only, and therefore that similar methodology may be employed with other multiple voltage domain circuit configurations.

Figure 6:
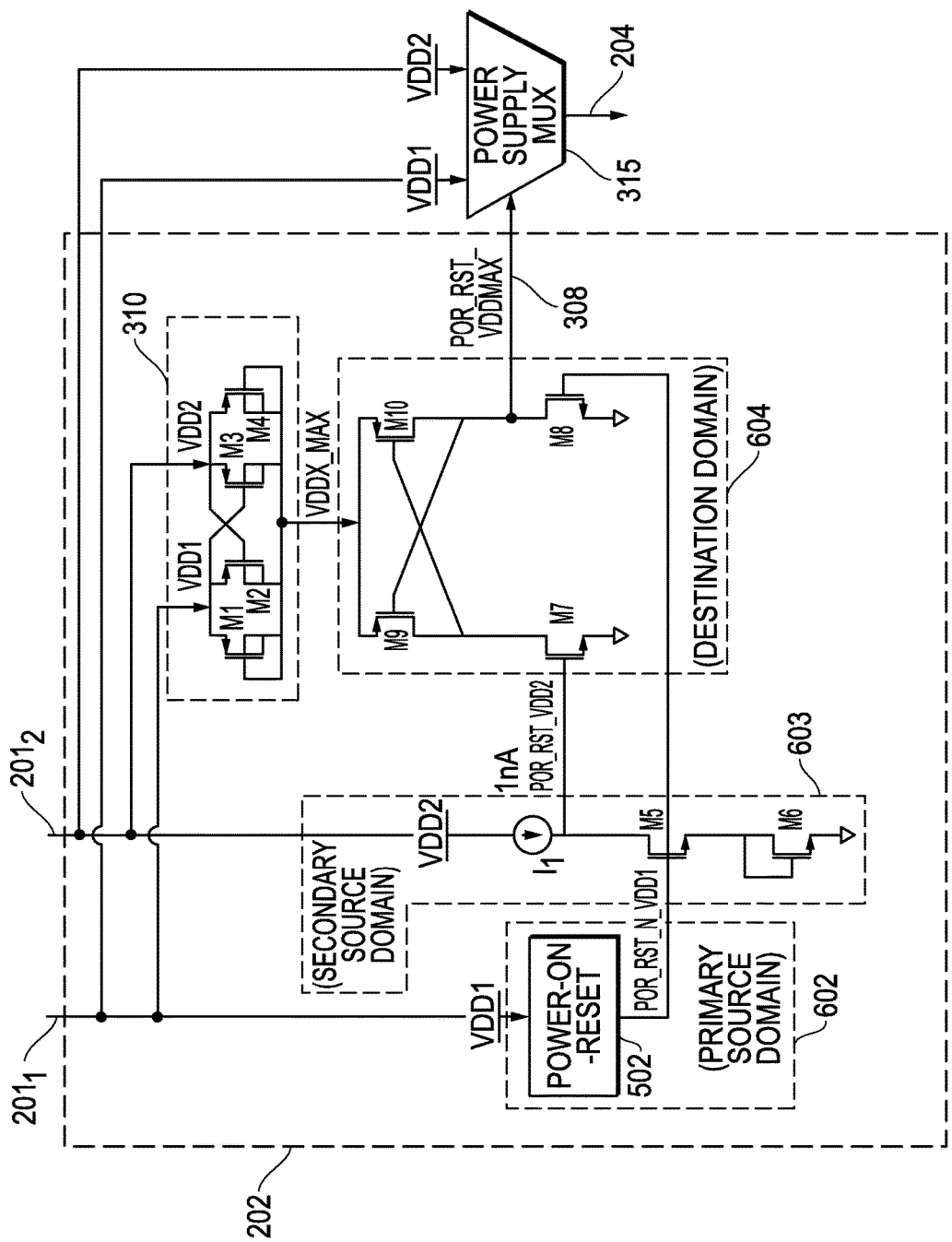
FIG. 6 illustrates power selection and distribution circuitry according to one exemplary embodiment of the disclosed systems and methods.

FIG. 6 illustrates another exemplary embodiment of power selection and distribution circuitry 202 which includes primary source domain circuitry 602 and secondary source domain circuitry 603 coupled to provide source mux-control-signals 306 that include por_rst_n_vdd1 and por_rst_n_vdd2, respectively, to destination domain circuitry 604. In this embodiment, primary source domain circuitry 602 includes POR 502 that is coupled to receive and monitor only alternate power supply $201_1$ (vdd1), and to in turn provide por_rst_n_vdd1 of source mux-control-signal 306 to destination domain circuitry 604. Secondary source domain circuitry 603 is coupled to receive default power supply vdd2 and to provide por_rst_vdd2 of source mux-control-signal 306 to destination domain circuitry 604 as shown. In this embodiment, secondary source domain circuitry and destination domain circuitry 604 of FIG. 6 are together configured to evaluate the validity of source mux-control-signal 306 using current source $I_1$ and transistor M5 and optional transistor M6 to ensure that destination mux-control-signal 308 has a voltage that causes power supply mux 315 to choose the correct default power supply vdd2 for power supply mux 315 when source mux-control-signal (por_rst_n_vdd1) 306 is undefined or otherwise invalid. In this embodiment, transistor M6 is configured with drain to gate connection to operate in similar manner described for transistor M3 of FIG. 5. Although not illustrated, it will be understood that source domain circuitry 602 may also include other optional logic components, e.g., such as a PMU for signal conditioning, etc.

In the embodiment of FIG. 6 transistors M1 through M4 of Vmax generator 310 generate the maximum (vddx_max) of the two power supplies (i.e., vdd1 or vdd2) for destination domain circuitry 604 in similar manner as previously described in relation to FIG. 5, and transistors M7 through M10 implement a cross-coupled-based level shifter of destination domain circuitry 604. In this case, the level shifter is not preferential, so there is no ratio. As shown, secondary source domain circuitry 603 also includes a current source $I_1$ (e.g., 1 nanoamp or other suitable greater or lesser current value) that is coupled in series with two NMOS transistors M5 and M6 between default power supply (vdd2) $201_2$ and ground, with a signal por_rst_vdd2 being generated at a node coupled between current source $I_1$ and NMOS transistor M5 as shown. The gate of transistor M5 is coupled to receive source mux-control-signal (por_rst_n_vdd1) 306 as shown. Signal por_rst_vdd2 is in turn coupled to the gate of NMOS transistor M7 of the cross-coupled-based level shifter that includes NMOS transistors M7 and M8 and PMOS transistors M9 and M10. Destination mux-control-signal 308 is in turn coupled as shown to node por_rst_vddmax that is between transistors M10 and M8 of the level shifter. In this configuration, destination mux-control-signal 308 is maintained high or in logic state "1" by vddx_max from Vmax generator 310 as long as power supply vdd2 is available and transistor M5 is turned off.

In operation of power selection and distribution circuitry 202 of FIG. 6, source mux-control-signal (por_rst_n_vdd1) 306 is level-shifted within destination domain circuitry 604 to the maximum of the two power supplies (i.e., vdd1 or vdd2) using two steps. In the first step, signal por_rst_n_vdd1 is shifted to vdd2 level (as por_rst_vdd2) by current source $I_1$ when transistor M5 is off, and in the second step the cross-coupled-based level shifter is used to level shift the signal to the maximum of vdd1 and vdd2. Thus, in the case that vdd1 is not present or undefined (e.g., vdd1 ramping up at startup) while vdd2 is valid and available, then source mux-control-signal (por_rst_n_vdd1) 306 is low but the signal por_rst_vdd2 is defined to be equal to vdd2 by current source $I_1$ since transistor M5 is turned off. Consequently, gate of NMOS transistor M7 is driven by vdd2 while gate of NMOS transistor M8 is driven by low por_rst_n_vdd1 (e.g., hundreds of millivolts) so the transistors M7 through M10 of the destination domain level shifter generate a correct output (i.e., transistors M7 and M10 are turned on while transistors M8 and M9 are turned off) such that voltage vddx_max is present at por_rst_vddmax node and the destination mux-control-signal 308 is high or logic state "1" which causes power supply mux to choose default power supply vdd2 for supply rail/s 204.

In the alternative case where vdd2 is not present or undefined (e.g., hundreds of millivolts) while vdd1 is valid and available, por_rst_n_vdd1 provided by POR 502 is equal to vdd1 and valid such that it turns on transistor M5 so that por_rst_vdd2 node is therefore pulled down through optional transistor M6. With transistor M5 on, the current $I_1$ flows to ground through M6, and due to the diode-connected nature of the transistor M6 the drain voltage is equal to the $V_{GS}$ of the transistor M6 at bias current $I_1$. $V_{GS}$ may be selected to be lower than the $V_{GS}$ required to turn on M7, or positive feedback may be used to short the drain and gate of M6 to ground. Thus, when transistors M5 is turned on, the gate of transistor M7 is driven by low voltage and the gate of transistor M8 is driven by fully powered valid voltage of vdd1 (i.e., meaning transistors M7 and M10 are turned off while transistors M8 and M9 are turned on), which results in node por_rst_vddmax and destination mux control 308 being pulled down to zero, which causes power supply mux 315 to select vdd1 for power supply rail/s 204. Thus, in the embodiment of FIG. 6, power selection and distribution circuitry 202 causes power supply mux 315 to select the first supply 201 (i.e., alternate power supply vdd1 or default power supply vdd2) that becomes available for supply rail 204 and circuit start-up; however, if both supplies 201 are available, the power selection and distribution circuitry 202 causes power supply mux 315 to select power supply vdd1 for supply rail 204 and circuit start-up. This is in contrast to the embodiment of FIG. 5 in which a default power supply of vdd1 is selected for supply rail 204 and circuit start-up independent of vdd2, such that the circuit never starts on alternate power supply vdd2 of FIG. 5.

It will be understood that the particular configuration of PMOSFET and NMOSFET transistor switching elements of the circuitry embodiments described and illustrated herein are exemplary only, and may be replaced by equivalent complementary metal-oxide semiconductor (CMOS) circuitry in which PMOSFET and NMOSFET transistor switching elements are juxtaposed, as can be appreciated by one of ordinary skill in the art. For example, one or more off transistors M1, M2 and M3 of FIG. 5 and transistors M5 and M6 of FIG. 6 may be alternatively implemented using PMOS transistors, e.g., with inverter circuits coupled to the transistor gate/s or otherwise configured to operate in accordance with logic states described herein.

It will also be understood that one or more of the tasks, functions, or methodologies described herein (e.g., including those described herein for components 202, 214, etc.) may be implemented at least in part by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a processing device of an information handling system such as CPU, controller, microcontroller, processor, microprocessor, FPGA, ASIC, or other suitable processing device) to perform one or more steps of the methodologies disclosed herein. In one embodiment, such processing devices may be selected from the group consisting of CPU, controller, microcontroller, processor, microprocessor, FPGA, and ASIC. A computer program of instructions may be stored in or on the non-transitory computer-readable medium accessible by an information handling system for instructing the information handling system to execute the computer program of instructions. The computer program of instructions may include an ordered listing of executable instructions for implementing logical functions in the information handling system. The executable instructions may comprise a plurality of code segments operable to instruct the information handling system to perform the methodology disclosed herein. It will also be understood that one or more steps of the present methodologies may be employed in one or more code segments of the computer program. For example, a code segment executed by the information handling system may include one or more steps of the disclosed methodologies.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed circuitry and methods may be utilized in various combinations and/or independently. Thus the invention is not limited to only those combinations shown herein, but rather may include other combinations.

What is claimed is:

1. A method of operating circuitry that is coupled to receive multiple power supplies, the method comprising:
   selecting a first power supply having the largest voltage among the multiple power supplies that are coupled to the circuitry, the multiple power supplies including a default power supply and an alternate power supply;
   using the selected largest voltage first power supply to power a first portion of the circuitry to:
      generate a first control signal in a high logic state to control a switching circuit to selectively couple the default power supply to at least one power supply rail to supply power for power-consuming circuit components of the circuitry in response to a low logic state of at least one second control signal received from a second portion of the circuitry, and
      generate the first control signal in a low logic state to control a switching circuit to selectively couple the alternate power supply to at least one power supply rail to supply power for the power-consuming circuit components of the circuitry in response to a high logic state of at least one second control signal received from the second portion of the circuitry; and
   providing a current from one of the multiple power supplies to maintain a voltage of the first control signal in the high logic state to control the switching circuit to couple the default power supply to the at least one power supply rail when the second control signal is not in the high logic state;
   where the first portion of the circuitry is coupled between the multiple power supplies and the switching circuit, and the second portion of the circuitry is coupled to the first portion of the circuitry; and where the second portion of the circuitry is separate and different circuitry from each of the first portion of the circuitry, the switching circuit, and the power-consuming circuit components.

2. The method of claim 1, further comprising selectively coupling the current from the current source to ground only when the voltage of the second control signal exceeds a pre-defined minimum second control signal threshold voltage level to pass sufficient current from the current source to ground to cause the voltage of the first control signal to drop to the voltage of the low logic state to control the switching circuit to couple the alternate power supply to the at least one power supply rail.

3. The method of claim 2, further comprising:
providing the second control signal to a gate of a N-channel metal-oxide-semiconductor (NMOS) field-effect transistor that is coupled in series between a source of the provided current and ground; and
providing the first control signal from the drain of the NMOS transistor;
where the pre-defined second control signal minimum threshold voltage level is set by a gate-to-source voltage ($V_{GS}$) of the NMOS transistor to correspond to a desired valid logic level for the second control signal when the drain current of the NMOS transistor is substantially equal to the provided current to cause the voltage of the first control signal at the drain of the NMOS transistor to drop to the voltage of the low logic state.

4. The method of claim 2, further comprising:
providing the second control signal to a gate of a N-channel metal-oxide-semiconductor (NMOS) field-effect transistor that is coupled in series between a source of the provided current and ground; and
providing the first control signal to control the switching circuit through a level shifter circuit that is coupled to the drain of the NMOS transistor;
where the pre-defined second control signal minimum threshold voltage level is set by a gate-to-source voltage ($V_{GS}$) of the NMOS transistor to correspond to a desired valid logic level for the second control signal when the drain current of the NMOS transistor is substantially equal to the provided current to cause the voltage of the first control signal at an output of the level shifter circuit to drop to the voltage of the low logic state.

5. The method of claim 2, further comprising selectively coupling the current from the current source to ground through a N-channel metal-oxide-semiconductor (NMOS) field-effect transistor having a gate coupled to a drain of the NMOS transistor at a node between the NMOS transistor and the current source.

6. The method of claim 2, further comprising:
providing the second control signal to a gate of a first N-channel metal-oxide-semiconductor (NMOS) field-effect transistor that is coupled in series with a second NMOS transistor between a source of the provided current and ground, the gate of the second NMOS transistor being coupled to a drain of the second NMOS transistor at a node between the first NMOS transistor and the second NMOS transistor, and the source of the second NMOS transistor being coupled to ground; and
providing the first control signal from the drain of the first NMOS transistor; and
where the pre-defined second control signal minimum threshold voltage level is set by a gate-to-source voltage ($V_{GS1}$) of the first NMOS transistor plus a gate-to-source voltage ($V_{GS2}$) of the second NMOS transistor to correspond to a desired valid logic level for the second control signal when the drain current of the first NMOS transistor is substantially equal to the provided current to cause the voltage of the first control signal at the drain of the first NMOS transistor to drop to the voltage of the low logic state.

7. The method of claim 2, further comprising:
providing the second control signal to a gate of a first N-channel metal-oxide-semiconductor (NMOS) field-effect transistor that is coupled in series with a second NMOS transistor between a source of the provided current and ground, the gate of the second NMOS transistor being coupled to a drain of the second NMOS transistor at a node between the first NMOS transistor and the second NMOS transistor, and the source of the second NMOS transistor being coupled to ground; and
providing the first control signal through a level shifter circuit that is coupled to the drain of the first NMOS transistor;
where the pre-defined second control signal minimum threshold voltage level is set by a gate-to-source voltage ($V_{GS1}$) of the first NMOS transistor plus a gate-to-source voltage ($V_{GS2}$) of the second NMOS transistor to correspond to a desired valid logic level for the second control signal when the drain current of the first NMOS transistor is substantially equal to the provided current to cause the voltage of the first control signal at an output of the level shifter circuit to drop to the voltage of the low logic state.

8. The method of claim 1, further comprising using a current source to provide the current from the selected largest voltage first power supply to maintain a voltage of the first control signal in the high logic state to control the switching circuit to couple the default power supply to the at least one power supply rail when the second control signal is not in the high logic state; and producing the first control signal from the provided current and at a voltage of the provided current from a first control signal node coupled to the output of the current source.

9. The method of claim 1, further comprising using a current source to provide the current from the default power supply to maintain a voltage of the first control signal in the high logic state through level shifter circuit to control the switching circuit to couple the default power supply to the at least one power supply rail when the second control signal is not in the high logic state; and producing the first control signal at a voltage of the selected largest voltage first power supply from a first control signal node coupled to the output of the level shift circuit.

10. The method of claim 1, further comprising producing the second control signal from any one of the available power supplies as a power-on-reset power selection control signal, a user-generated power selection control signal, or a combination thereof.

11. An apparatus comprising circuitry configured for coupling between power consuming circuitry and multiple power supplies that include a default power supply and an alternate power supply, the circuitry comprising;
a switching circuit configured to selectively couple each of the multiple power supplies to at least one power supply rail to supply power for the power-consuming circuit components;
a first circuit portion coupled to be powered by a first power supply that has the largest voltage among the multiple power supplies, the multiple power supplies including a default power supply and an alternate power supply, and the first circuit portion being configured to:
  generate a first control signal in a high logic state to control the switching circuit to selectively couple the default power supply to the at least one power supply rail to supply power for power-consuming circuit components of the circuitry in response to a low logic state of at least one second control signal received from a second portion of the circuitry, and
  generate the first control signal in a low logic state to control a switching circuit to selectively couple the alternate power supply to at least one power supply rail to supply power for the power-consuming circuit components of the circuitry in response to a high logic state of at least one second control signal received from the second portion of the circuitry; and
a current source coupled to provide a current from one of the multiple power supplies to maintain a voltage of the first control signal in the high logic state to control the switching circuit to couple the default power supply to the at least one power supply rail when the second control signal is not in the high logic state;
where the first circuit portion is coupled between the multiple power supplies and the switching circuit, and the second portion of the circuitry is coupled to the first circuit portion; and
where the second portion of the circuitry is separate and different circuitry from each of the first circuit portion, the switching circuit, and the power-consuming circuit components.

12. The apparatus of claim 11, further comprising a first transistor switching element configured to be coupled in series between the current source and ground, the first transistor switching element being configured to selectively route the current from the current source to ground only when the voltage of the second control signal exceeds a pre-defined minimum second control signal threshold voltage level to pass sufficient current from the current source to ground to cause the voltage of the first control signal to drop to the voltage of the low logic state to control the switching circuit to couple the alternate power supply to the at least one power supply rail.

13. The apparatus of claim 12, where the first transistor switching element comprises a first N-channel metal-oxide-semiconductor (NMOS) field-effect transistor; where a gate of the first NMOS transistor is coupled to receive the second control signal from the second portion of the circuitry; where a drain of the first NMOS transistor is coupled to a node that is common with a signal path of the first control signal; and where the pre-defined second control signal minimum threshold voltage level is set by a gate-to-source voltage ($V_{GS}$) of the first NMOS transistor to correspond to a desired valid logic level for the second control signal when the drain current of the first NMOS transistor is substantially equal to the provided current to cause the voltage of the first control signal at the drain of the first NMOS transistor to drop to the voltage of the low logic state.

14. The apparatus of claim 12, where the first transistor switching element comprises a first N-channel metal-oxide-semiconductor (NMOS) field-effect transistor; where a gate of the first NMOS transistor is coupled to receive the second control signal from the second portion of the circuitry; where the apparatus further comprises a level shifter circuit coupled to a drain of the first NMOS transistor to provide the first control signal to the switching circuit; and where the pre-defined second control signal minimum threshold voltage level is set by a gate-to-source voltage ($V_{GS}$) of the first NMOS transistor to correspond to a desired valid logic level for the second control signal when the drain current of the first NMOS transistor is substantially equal to the provided current to cause the voltage of the first control signal at an output of the level shifter circuit to drop to the voltage of the low logic state.

15. The apparatus of claim 12, where the first transistor switching element comprises a first N-channel metal-oxide-semiconductor (NMOS) field-effect transistor; where the apparatus further comprises a second NMOS transistor element having a drain coupled to the source of the first NMOS transistor and the second NMOS transistor having a source configured to be coupled to ground; and where a gate of the second NMOS transistor is coupled to the drain of the second NMOS transistor at a node between the source of the first NMOS transistor and the drain of the second NMOS transistor current source to selectively route current from the current source through the first and second NMOS transistors.

16. The apparatus of claim 12, where the first transistor switching element comprises a first N-channel metal-oxide-semiconductor (NMOS) field-effect transistor; where a gate of the first NMOS transistor is coupled to receive the second control signal from the second portion of the circuitry; where the apparatus further comprises a second NMOS transistor configured to be coupled in series with the first NMOS transistor between the current source and ground; where the gate of the second NMOS transistor is coupled to a drain of the second NMOS transistor at a node between the first NMOS transistor and the second NMOS transistor, and the source of the second NMOS transistor is configured to be coupled to ground; where the drain of the first NMOS transistor is coupled at a node that is common with a signal path of the first control signal; and where the pre-defined second control signal minimum threshold voltage level is set by a gate-to-source voltage ($V_{GS1}$) of the first NMOS transistor plus a gate-to-source voltage ($V_{GS2}$) of the second NMOS transistor to correspond to a desired valid logic level for the second control signal when the drain current of the first NMOS transistor is substantially equal to the provided current to cause the voltage of the first control signal at the drain of the first NMOS transistor to drop to the voltage of the low logic state.

17. The apparatus of claim 12, where the first transistor switching element comprises a first N-channel metal-oxide-semiconductor (NMOS) field-effect transistor; where a gate of the first NMOS transistor is coupled to receive the second control signal from the second portion of the circuitry; where the apparatus further comprises:
  a second NMOS transistor configured to be coupled in series with the first NMOS transistor between the current source and ground; where the gate of the second NMOS transistor is coupled to a drain of the second NMOS transistor at a node between the first NMOS transistor and the second NMOS transistor, and the source of the second NMOS transistor is configured to be coupled to ground; and
  a level shifter circuit coupled to the drain of the first NMOS transistor and having an output coupled to provide the first control signal to the switching circuit;
  where the pre-defined second control signal minimum threshold voltage level is set by a gate-to-source voltage ($V_{GS1}$) of the first NMOS transistor plus a gate-to-source voltage ($V_{GS2}$) of the second NMOS transistor to correspond to a desired valid logic level for the second control signal when the drain current of the first NMOS transistor is substantially equal to the provided current to cause the voltage of the first control signal at the output of the level shifter circuit to drop to the voltage of the low logic state.

18. The apparatus of claim 11, where the current source is coupled to provide the current from the selected largest voltage first power supply to maintain a voltage of the first control signal in the high logic state to control the switching circuit to couple the default power supply to the at least one power supply rail when the second control signal is not in the high logic state; and where the output of the current source is coupled at a first control signal node to provide current to produce the first control signal at a voltage of the provided current of the current source.

19. The apparatus of claim 11, further comprising a level shifter circuit coupled between an output of the current source and a first control signal output node; where the level shifter circuit is coupled to receive the selected largest voltage first power supply; where the current source is coupled to provide current from the default power supply to maintain a voltage of the first control signal in the high logic state through the level shifter circuit to control the switching circuit to couple the default power supply to the at least one power supply rail when the second control signal is not in the high logic state; and where an output of the level shifter circuit is coupled at the first control signal node to produce the first control signal at a voltage of the selected largest voltage first power supply.

20. An integrated circuit device configured for coupling to multiple power supplies that include a default power supply and an alternate power supply, the integrated circuit device comprising;
  power-consuming circuit components coupled to receive power from at least one power supply rail;
  a switching circuit configured to selectively couple each of the multiple power supplies to the power supply rail to supply power for the power-consuming circuit components;
  a first circuit portion coupled to be powered by a first power supply that has the largest voltage among the multiple power supplies, the multiple power supplies including a default power supply and an alternate power supply, and the first circuit portion being configured to:
    generate a first control signal in a high logic state to control the switching circuit to selectively couple the default power supply to the at least one power supply rail to supply power for the power-consuming circuit components of the circuitry in response to a low logic state of at least one second control signal received from a second portion of the circuitry, and
    generate the first control signal in a low logic state to control a switching circuit to selectively couple the alternate power supply to at least one power supply rail to supply power for the power-consuming circuit components of the circuitry in response to a high logic state of at least one second control signal received from the second portion of the circuitry; and
  a current source coupled to provide a current from one of the multiple power supplies to maintain a voltage of the first control signal in the high logic state to control the switching circuit to couple the default power supply to the at least one power supply rail when the second control signal is not in the high logic state;
  where the first circuit portion is coupled between the multiple power supplies and the switching circuit, and the second portion of the circuitry is coupled to the first circuit portion; and
  where the second portion of the circuitry is separate and different circuitry from each of the first circuit portion, the switching circuit, and the power-consuming circuit components.

21. The method of claim 1, where the second portion of the circuitry is coupled between the switching circuit and the first portion of the circuit; where the switching circuit is coupled between the multiple power supplies and the second portion of the circuitry; and where the method further comprises using the selected largest voltage first power supply to power the first portion of the circuitry to:
  generate the first control signal in a high logic state to control the switching circuit to selectively couple the default power supply to at least one power supply rail to supply power at a node between the switching circuit and the second portion of the circuitry for the power-consuming circuit components of the circuitry in response to a low logic state of at least one second control signal received from the second portion of the circuitry, and
  generate the first control signal in a low logic state to control the switching circuit to selectively couple the alternate power supply to at least one power supply rail to supply power at the node between the switching circuit and the second portion of the circuitry for the power-consuming circuit components of the circuitry in response to a high logic state of at least one second control signal received from the second portion of the circuitry.

22. The apparatus of claim 11, where the second portion of the circuitry is coupled between the switching circuit and the first circuit portion; where the switching circuit is coupled between the multiple power supplies and the second portion of the circuitry; and where the first circuit portion is configured to:
  generate the first control signal in a high logic state to control the switching circuit to selectively couple the default power supply to at least one power supply rail to supply power at a node between the switching circuit and the second portion of the circuitry for the power-consuming circuit components of the circuitry in response to a low logic state of at least one second control signal received from the second portion of the circuitry, and
  generate the first control signal in a low logic state to control the switching circuit to selectively couple the alternate power supply to at least one power supply rail to supply power at the node between the switching circuit and the second portion of the circuitry for the power-consuming circuit components of the circuitry in response to a high logic state of at least one second control signal received from the second portion of the circuitry.

23. The integrated circuit device of claim 20, where the second portion of the circuitry is coupled between the switching circuit and the first circuit portion; where the switching circuit is coupled between the multiple power supplies and the second portion of the circuitry; and where the first circuit portion is configured to:
  generate the first control signal in a high logic state to control the switching circuit to selectively couple the default power supply to at least one power supply rail to supply power at a node between the switching circuit and the second portion of the circuitry for the power-consuming circuit components of the circuitry in response to a low logic state of at least one second control signal received from the second portion of the circuitry, and generate the first control signal in a low logic state to control the switching circuit to selectively couple the alternate power supply to at least one power supply rail to supply power at the node between the switching circuit and the second portion of the circuitry for the power-consuming circuit components of the circuitry in response to a high logic state of at least one second control signal received from the second portion of the circuitry.

* * * * *